United States Patent
Tran et al.

(10) Patent No.: US 10,642,091 B2
(45) Date of Patent: May 5, 2020

(54) DISPLAYS

(71) Applicant: Radiant Choice Limited, The Valley (AI)

(72) Inventors: Nguyen The Tran, Anaheim, CA (US); Jiun-Pyng You, Irvine, CA (US)

(73) Assignee: RADIANT CHOICE LIMITED, The Valley (AI)

( * ) Notice: Subject to any disclaimer, the term of this patent is extended or adjusted under 35 U.S.C. 154(b) by 0 days.

(21) Appl. No.: 16/244,527

(22) Filed: Jan. 10, 2019

(65) Prior Publication Data
US 2019/0243185 A1   Aug. 8, 2019

Related U.S. Application Data

(60) Provisional application No. 62/626,158, filed on Feb. 5, 2018.

(51) Int. Cl.
*G02F 1/1335*   (2006.01)
*G02F 1/13357*  (2006.01)
*H01L 33/50*    (2010.01)

(52) U.S. Cl.
CPC .. *G02F 1/133514* (2013.01); *G02F 1/133603* (2013.01); *G02F 2001/133614* (2013.01); *H01L 33/502* (2013.01)

(58) Field of Classification Search
None
See application file for complete search history.

(56) References Cited

U.S. PATENT DOCUMENTS

| | | | |
|---|---|---|---|
| 2016/0042703 A1* | 2/2016 | Fan | G09G 3/3607 345/88 |
| 2017/0192304 A1* | 7/2017 | Matsuura | G02B 6/0031 |
| 2017/0315405 A1* | 11/2017 | Masuda | G02B 5/223 |
| 2018/0275331 A1* | 9/2018 | Harada | G02F 1/133615 |

* cited by examiner

*Primary Examiner* — Richard H Kim
(74) *Attorney, Agent, or Firm* — Locke Lord LLP; Tim Tingkang Xia, Esq.

(57) ABSTRACT

Aspects of the invention include a display device including a liquid crystal display (LCD) panel comprising a plurality of blue color filters, a plurality of green color filters, and a plurality of red color filters; and a light source configured to provide light to the LCD panel. The light has a spectrum with a blue component, a green component and a red component. In one embodiment, the blue component has at least one peak wavelength in between 465 nm to 495 nm. In another embodiment, the blue component has an intensity being broadly distributed over a wavelength range of 430 nm to 495 nm. The plurality of green color filters has a transmission cut off wavelength being 480 nm or greater than 480 nm. The plurality of blue color filters has a transmission cut off wavelength being no greater than 500 nm.

5 Claims, 7 Drawing Sheets

| Blue Type | Color Filter | NTSC | | Rec. 2020 |
| --- | --- | --- | --- | --- |
| | | Gamut Ratio (%) | Gamut Coverage (%) | Gamut Coverage (%) |
| Short Blue | G-CF0 | 101.6 | 90.4 | 75.8 |
| 471nm peak | G-CF0 | 83.9 | 78.0 | 62.5 |
| 471nm peak | G-CF1 | 100.2 | 94.4 | 74.7 |
| 471nm peak | G-CF2 | 102.6 | 93.9 | 75.4 |
| 471nm peak | G-CF3 | 102.5 | 93.0 | 76.3 |
| Three Peak | G-CF0 | 96.5 | 87.6 | 72.0 |
| Three Peak | G-CF1 | 102.9 | 92.0 | 76.8 |
| Three Peak | G-CF2 | 103.6 | 91.3 | 77.4 |
| Three Peak | G-CF3 | 103.3 | 90.4 | 77.1 |
| RGB: 471nm | G-CF0 | 92.5 | 81.6 | 68.5 |
| RGB: 471nm | G-CF1 | 110.2 | 97.3 | 81.8 |
| RGB: 471nm | G-CF2 | 112.9 | 97.5 | 83.9 |
| RGB: 471nm | G-CF3 | 113.1 | 97.5 | 84.1 |
| RGB: 450nm | G-CF0 | 111.7 | 97.3 | 83.2 |
| RGB: 471nm | na | 114.1 | 98.6 | 84.6 |
| RGB: 450nm | na | 119.5 | 97.9 | 87.4 |

FIG. 7

DISPLAYS

CROSS-REFERENCE TO RELATED PATENT APPLICATION

This application claims priority to and the benefit of, pursuant to 35 U.S.C. § 119(e), U.S. provisional patent application Ser. No. 62/626,158, filed Feb. 5, 2018, which is incorporated herein by reference in its entirety.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference is individually incorporated by reference.

FIELD

The present disclosure relates generally to displays, and more particularly to displays with long blue wavelength and modified color filters.

BACKGROUND

The background description provided herein is for the purpose of generally presenting the context of the present disclosure. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions. Work of the presently named inventors, to the extent it is described in the background of the invention section, as well as aspects of the description that may not otherwise qualify as prior art at the time of filing, are neither expressly nor impliedly admitted as prior art against the present disclosure.

Digital displays have become inseparable part of our human activity. The displays can be outdoor and indoor large/small displays, televisions (TVs), handheld displays, backlighting based displays, self-emitting displays, and reflective displays. The displays can be source-based displays such as light-emitting diode (LED), organic light-emitting diode (OLED), quantum dot (QD), and laser. They can be passive or active emission devices.

Currently, source-based displays use a white light with short blue wavelength with wavelength peak ranging between 440 nm to 460 nm. There are two reasons for this. One reason is that excitation wavelength of most wavelength conversion materials are limited up to or maximized at this value. Another reason is that green color filters can transmit a significant amount of blue light with wavelength up to 470 nm. This results in low color gamut for blue light with its peak wavelength falling into a wavelength range above 465 nm or 470 nm. Short blue wavelength in digital displays may cause tiredness related to eyestrains after a prolonged and frequent use of digital devices. This may lower work productivity.

Therefore, a heretofore unaddressed need exists in the art to address the aforementioned deficiencies and inadequacies.

SUMMARY

The invention, in one aspect, relates to a display. The display includes a liquid crystal display (LCD) panel including a plurality of blue color filters, a plurality of green color filters, and a plurality of red color filters; and a light source configured to provide light to the LCD panel, wherein the light has a spectrum with a blue component, a green component and a red component. The blue component has at least one peak wavelength in between 465 nm to 495 nm.

In one embodiment, the blue component has intensity of a peak at a longer wavelength being higher than that at a shorter wavelength.

In one embodiment, the light source includes at least one of blue LED chips, blue LD chips, and blue OLED chips for emitting the blue component. Alternatively, the light source includes at least one of blue LED chips, blue LD chips, and blue OLED chips for emitting the blue component, and of green LED chips, green LD chips, and green OLED chips for emitting the green component.

In one embodiment, the light source further includes green and red wavelength conversion materials for emitting the green component and the red component when excited by the blue component. Alternatively, the light source further includes red wavelength conversion materials for emitting the red component when excited by the blue component and/or the green component.

In one embodiment, the wavelength conversion materials include at least one of phosphor materials, quantum dot materials, dye materials.

In one embodiment, the light source is a backlight unit.

In one embodiment, the plurality of green color filters has a transmission cut off wavelength being 480 nm or greater than 480 nm.

In one embodiment, the plurality of blue color filters has a transmission cut off wavelength being no greater than 500 nm.

In yet another aspect, the invention relates to a display device. The display device includes a liquid crystal display (LCD) panel including a plurality of blue color filters, a plurality of green color filters, and a plurality of red color filters; and a light source configured to provide light to the LCD panel, wherein the light has a spectrum with a blue component, a green component and a red component. The blue component has an intensity being broadly distributed over a wavelength range of 430 nm to 495 nm.

In one embodiment, the blue component has a peak ranging from 470 nm to 490 nm.

In one embodiment, the light source includes at least one of blue LED chips, blue LD chips, and blue OLED chips for emitting the blue component. Alternatively, the light source includes at least one of blue LED chips, blue LD chips, and blue OLED chips for emitting the blue component, and of green LED chips, green LD chips, and green OLED chips for emitting the green component.

In one embodiment, the light source further includes green and red wavelength conversion materials for emitting the green component and the red component when excited by the blue component. Alternatively, the light source further includes red wavelength conversion materials for emitting the red component when excited by the blue component and/or the green component.

In one embodiment, the wavelength conversion materials include at least one of phosphor materials, quantum dot materials, dye materials.

In one embodiment, the light source is a backlight unit.

In one embodiment, the plurality of green color filters has a transmission cut off wavelength being 480 nm or greater than 480 nm.

In one embodiment, the plurality of blue color filters has a transmission cut off wavelength being no greater than 500 nm.

In yet another aspect, the invention relates to a light source for provide light having a spectrum with a blue component, a green component and a red component, for a display device. The light source includes at least one of blue LED chips, blue LD chips, and blue OLED chips for emitting the blue component; and green and red wavelength conversion materials for emitting the green component and the red component when excited by the blue component. The blue component has at least one peak wavelength in between 465 nm to 495 nm, and intensity of a peak at a longer wavelength being higher than that at a shorter wavelength. The blue component has an intensity being broadly distributed over a wavelength range of 430 nm to 495 nm, and a peak ranging from 470 nm to 490 nm.

In one embodiment, the wavelength conversion materials include at least one of phosphor materials, quantum dot materials, dye materials.

In yet another aspect, the invention relates to a light source for provide light having a spectrum with a blue component, a green component and a red component, for a display device. The light source includes at least one of blue LED chips, blue LD chips, and blue OLED chips for emitting the blue component, and of green LED chips, green LD chips, and green OLED chips for emitting the green component; and red wavelength conversion materials for emitting the red component when excited by the blue component and the blue component. The blue component has at least one peak wavelength in between 465 nm to 495 nm, and intensity of a peak at a longer wavelength being higher than that at a shorter wavelength. The blue component has an intensity being broadly distributed over a wavelength range of 430 nm to 495 nm, and a peak ranging from 470 nm to 490 nm.

In one embodiment, the wavelength conversion materials include at least one of phosphor materials, quantum dot materials, dye materials.

These and other aspects of the invention will become apparent from the following description of the preferred embodiment taken in conjunction with the following drawings, although variations and modifications therein may be affected without departing from the spirit and scope of the novel concepts of the invention.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment.

FIG. 7 is a diagram illustrating a NTSC gamut ratio and gamut coverage as well as Rec. 2020 gamut coverage of different color filters with different types of blue light.

DETAILED DESCRIPTION

Figure 1:
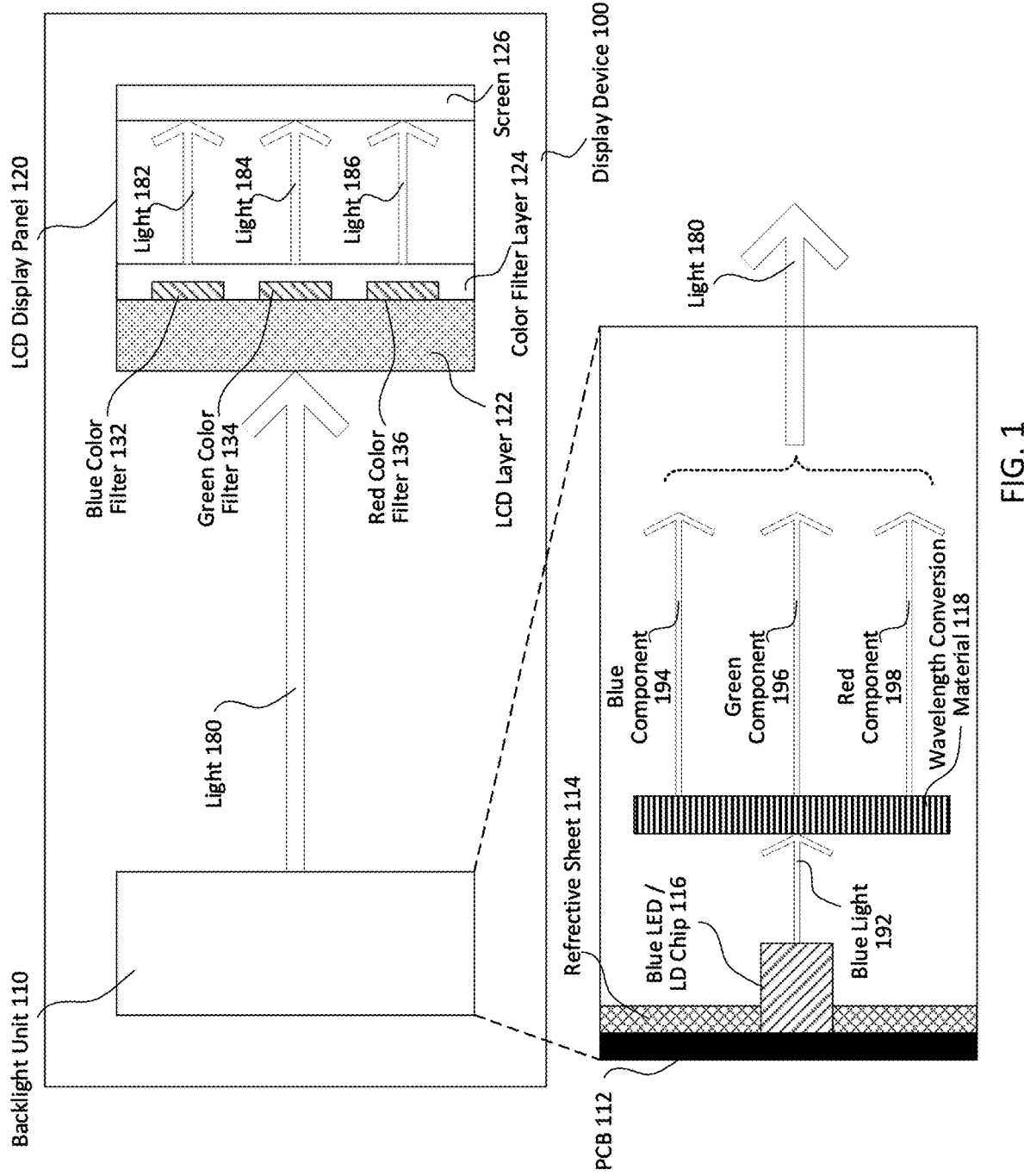
FIG. 1 is a schematic of a display device according to one embodiment of the invention.

The disclosure will now be described more fully hereinafter with reference to the accompanying drawings, in which exemplary embodiments of the disclosure are shown. This invention may, however, be embodied in many different forms and should not be construed as limited to the embodiments set forth herein. Rather, these embodiments are provided so that this disclosure will be thorough and complete, and will fully convey the scope of the disclosure to those skilled in the art. Like reference numerals refer to like elements throughout.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting and/or capital letters has no influence on the scope and meaning of a term; the scope and meaning of a term are the same, in the same context, whether or not it is highlighted and/or in capital letters. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only and in no way limits the scope and meaning of the disclosure or of any exemplified term. Likewise, the disclosure is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below can be termed a second element, component, region, layer or section without departing from the teachings of the disclosure.

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" to another feature may have portions that overlap or underlie the adjacent feature.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top", may be used herein to describe one element's relationship to another element as illustrated in the figures. It will be understood that relative terms are intended to encompass different orientations of the device in addition to the orientation shown in the figures. For example, if the device in one of the figures is turned over, elements described as being on the "lower" side of other elements would then be oriented on the "upper" sides of the other elements. The exemplary term "lower" can, therefore, encompass both an orientation of lower and upper, depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the phrase "at least one of A, B, and C" should be construed to mean a logical (A or B or C), using a non-exclusive logical OR. As used herein, the term "and/or" includes any and all combinations of one or more of the associated listed items.

Typically, terms such as "about," "approximately," "generally," "substantially," and the like unless otherwise indicated mean within 20 percent, preferably within 10 percent, preferably within 5 percent, and even more preferably within 3 percent of a given value or range. Numerical quantities given herein are approximate, meaning that the term "about," "approximately," "generally," or "substantially" can be inferred if not expressly stated.

The description below is merely illustrative in nature and is in no way intended to limit the invention, its application, or uses. The broad teachings of the invention can be implemented in a variety of forms. Therefore, while this invention includes particular examples, the true scope of the invention should not be so limited since other modifications will become apparent upon a study of the drawings, the specification, and the following claims. For purposes of clarity, the same reference numbers will be used in the drawings to identify similar elements. It should be understood that one or more steps within a method may be executed in different order (or concurrently) without altering the principles of the invention.

According to the invention, a display (e.g., a digital display) contains a light source having blue light component with its peak wavelength ranging above 465 nm and a green color filter with insignificant transmission of blue light of the proposed light source so that a wide color gamut can be obtained with the proposed light source. The digital display has a light emitting source that is configured to provide light for the display. The light emitting sources can be light emitting chips such as light emitting diode (LED) chips and laser diode (LD) chips, or organic light emitting diode (OLED) devices, and/or wavelength conversion materials. The light from different light emitting sources can be combined to generate different color of light including white light, depending on intensity level of each source.

FIG. 1 is a schematic of a display device 100 according to one embodiment of the invention. The display device 100 has a light source (e.g., a backlight unit 110) and a LCD display panel 120.

It should be noted that the backlight unit 110 can be achieved by many different ways. As shown in FIG. 1, one example of the backlight unit 110 has a printed circuit board (PCB) 112, a reflective sheet 114, a blue LED or LD chip 116, a wavelength conversion material 118. The blue LED or LD chip 116 is placed on the PCB 112, and the reflective sheet 113 is also placed on the PCB 112. The reflective sheet 113 has holes defined corresponding to the location of the blue LED or LD chip 116, and is placed on the PCB 112 such that the blue LED or LD chip 116 is exposed to the holes of the reflective sheet 114. The blue LED or LD chip 116 emits blue light 192, and the blue light 192 passes through the wavelength conversion material 118. The wavelength conversion materials are excited by the blue light 192 emitted from the blue LED or LD chip 116, and may emit light with different wavelength (e.g., green light and red light). For example, after passing through the wavelength conversion material 118, the blue light 192 becomes light 180 which has three components: the blue component 194, the green component 196, and the red component.

The wavelength conversion material 118 may be any of phosphor materials and quantum dot (QD) materials that can be excited by the blue light 192 emitted from the blue LED or LD chip 116 and emits at least one of the green component 196 and the red component 198. In certain embodiments, there may be more than one wavelength conversion materials 118. For example, one wavelength conversion material 118 emits a green component 196 and another wavelength conversion material 118 emits a red component 198.

In certain embodiments, the wavelength conversion material 118 may be coated on the blue LED or LD chip 116.

In certain embodiments, the wavelength conversion material 118 may be in remote configuration of the wavelength conversion structure as shown in FIG. 1.

As stated above, there may be other ways to achieve the backlight unit 110. In certain embodiments, the backlight unit 110 may have at least one blue LED/LD chip 116, at least one green LED/LD chip, and at least one red wavelength conversion material. The red wavelength conversion material can be excited by light emitted from the blue LED/LD chip 116 and the green LED/LD chip. In other words, the light 180 has three components: the blue component 194, the green component 196 and the red component 198, while the red component 198 is emitted from the red wavelength conversion material.

In certain embodiments, the backlight unit 110 has at least one blue LED/LD chip, at least on green LED/LD chip, and at least one red LED/LD chip. In other words, the light 180 has three components: the blue component 194, the green component 196 and the red component 198, while none of them are emitted from wavelength conversion material.

In certain embodiments, the backlight unit 110 has at least one violet or purple LED/LD chip. The wavelength conversion material can be any of phosphor materials and QD materials that can be excited by the light emitted from the violet or purple LED/LD chip and emits at least one of blue, green and red wavelength spectrum (i.e., at least one of blue component 194, green component 196 and red component 198). In certain embodiments, the blue wavelength spectrum can have a broad distribution of intensity to reduce eyestrain.

Conventional light spectrum has a short blue wavelength. However, the light source (e.g., the backlight unit 110) of the current invention can be constructed with shifted blue wavelength peak to a longer wavelength range or spreading intensity of blue wavelength while maintaining high color quality of the light source (e.g., the backlight unit 110).

Figure 2:
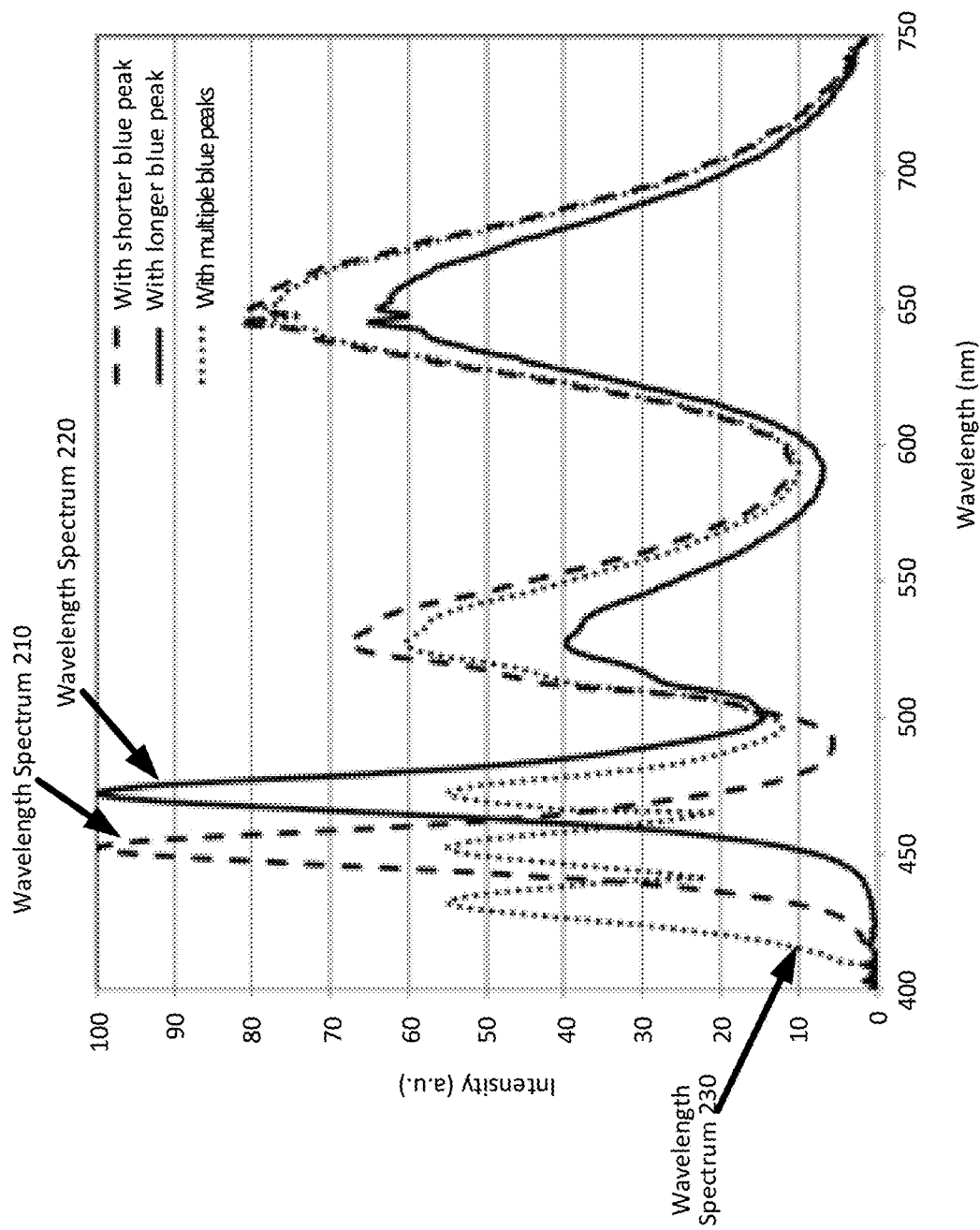
FIG. 2 is a diagram illustrating wavelength spectrum of a conventional light spectrum with shorter blue wavelength, wavelength spectrum of a light source with longer blue wavelength according to one embodiment of the invention, and wavelength spectrum of a light source with multiple peaks of blue wavelength to spread out the blue intensity according to another embodiment of the invention.

FIG. 2 shows examples of wavelength spectrum of a conventional light spectrum with shorter blue wavelength, wavelength spectrum of a light source (e.g., the backlight unit 110) with longer blue wavelength according to one embodiment of the invention, and wavelength spectrum of a light source with multiple peaks of blue wavelength to spread out the blue intensity according to another embodiment of the invention. The wavelength range of FIG. 2 is from 400 nm to 750 nm.

The wavelength spectrum 210, illustrated by a dash line in FIG. 2, is a wavelength spectrum of a conventional light spectrum with shorter blue wavelength. As mentioned above, the wavelength peak ranges between 440 nm to 460 nm. On the other hand, the wavelength spectrum 220, illustrated by a solid line in FIG. 2, is a wavelength spectrum of a light source with longer blue wavelength according to one embodiment of the invention. The light source can provide light spectrum that contains blue component of shifted blue peak wavelength with its peak ranging from 465 nm to 495 nm. In other words, the light source with longer blue wavelength according to one embodiment of the invention has a shifted blue wavelength peak to longer wavelength range (i.e., shifted from 440~460 nm to 465~495 nm, compared to the wavelength spectrum 210).

In certain embodiments, blue component of the light source has wavelength ranging from 430 nm to 495 nm, with its peak ranging from 470 nm to 490 nm. And the intensity or amount of shorter blue wavelength (i.e., shorter than 455 nm) is very small compared to the longer blue wavelength. In other words, blue component with longer blue wavelength is stronger in intensity than that with shorter blue wavelength.

In certain embodiments, and preferably, blue component of the light source has wavelength ranging from 450 nm to 495 nm, with its peak ranging from 470 nm to 490 nm. And the intensity or amount of shorter blue wavelength (i.e., shorter than 455 nm) is very small compared to the longer blue wavelength. In other words, blue component with longer blue wavelength is stronger in intensity than that with shorter blue wavelength.

Moreover, the wavelength spectrum 230, illustrated by another dash line in FIG. 2, is a wavelength spectrum of a light source with multiple peaks of blue wavelength to spread out the blue intensity. For example, the wavelength spectrum 230 has three peaks as illustrated in FIG. 2. It should be noted that other number of peaks (e.g., five peaks) can also be employed. As the wavelength spectrum 230 has multiple peaks of blue wavelength, the blue component intensity is spread out. For example, the peaks of the wavelength spectrum 230 have intensities lower than 60 a.u. as shown in FIG. 2.

More specifically, in certain embodiments, the blue LED/LD chip 116 emits light with its peak ranging from 465 nm to 490 nm. In certain embodiments, a plurality of blue LED/LD chips 116 emit light with a plurality of peaks ranging from 430 nm to 490 nm, and the peak with a longest wavelength has a higher intensity than the peak with a shorter wavelength. In certain embodiments, the blue LED/LD chip(s) 116 emits light with a broad bandwidth in blue wavelength range of the spectrum.

In liquid crystal display, color filters such as blue, green and red color filters are required to make blue, green and red color pixels, respectively. Currently, green color filter transmits significant amount of blue wavelength down to 465 nm. This results in the CIE coordinate (i.e., CIE 1931 color spaces) of the green pixel being shifted toward cyan region, when the light source contains large portion of blue wavelength energy that can be transmitted through the green color filter.

Figure 3:
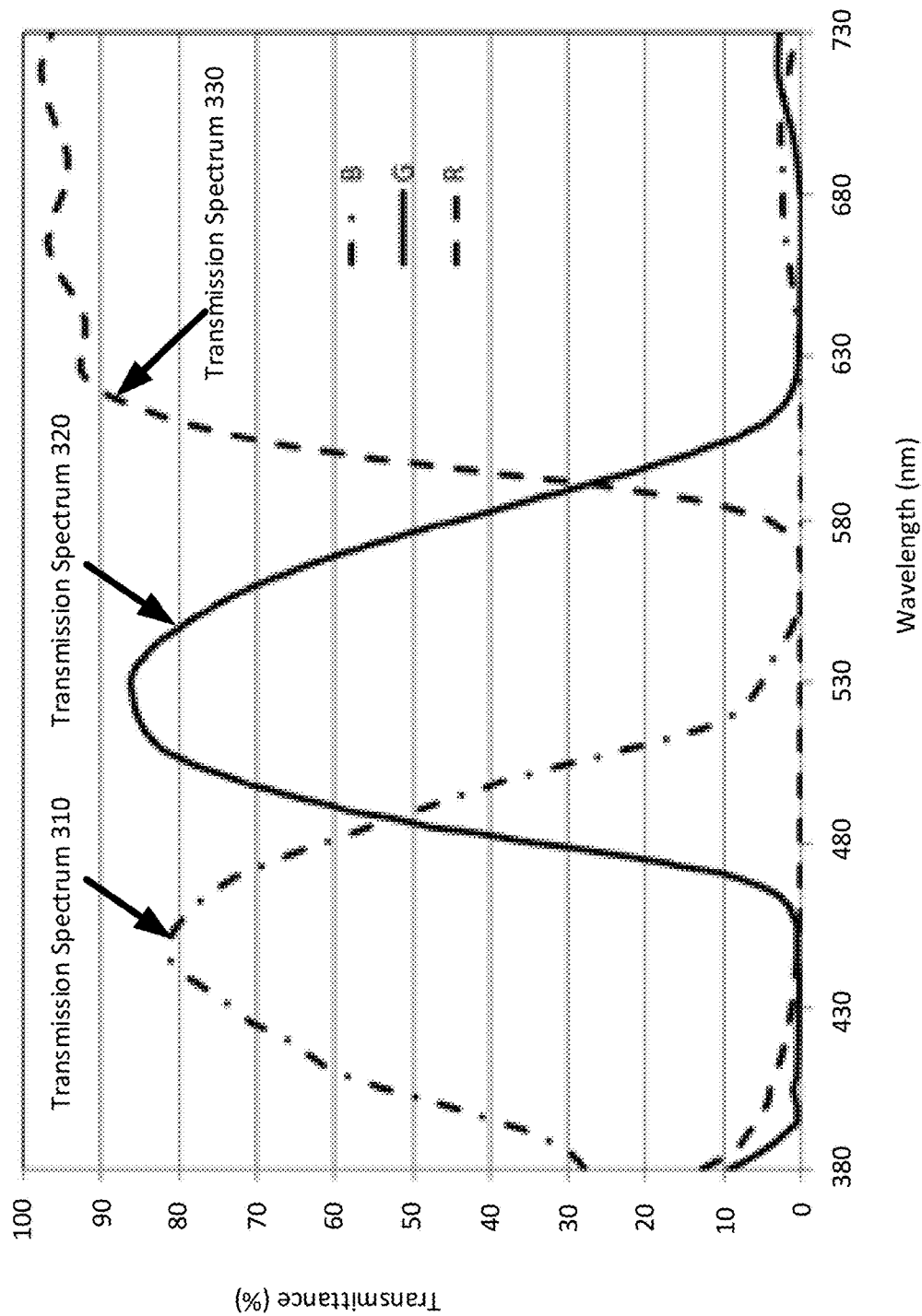
FIG. 3 is a diagram illustrating the transmission spectra of conventional green, blue and red color filters.

FIG. 3 shows the transmission spectra of conventional green color filter as well as blue and red color filter. As shown in FIG. 3, the transmission spectrum 310 is that of a conventional blue color filter, the transmission spectrum 320 is that of a conventional green color filter, and the transmission spectrum 330 is that of a conventional red color filter. The transmission spectrum 310 has a high transmittance in the blue wavelength region, the transmission spectrum 320 has a high transmittance in the green wavelength region, and the transmission spectrum 330 has a high transmittance in the red wavelength region. As shown in FIG. 3, the conventional green color filter transmits up to 4%, 10% and 20% of blue light at wavelength of 465 nm, 470 nm and 475 nm, respectively. As mentioned above, the results in the CIE coordinate of the green pixel being shifted toward cyan region. Therefore, it is desirable to tune the green color filter such that the green color filter can block blue wavelength to reduce interference of the blue wavelength on the green pixels. In other words, the green color filter 134 needs to be tuned to remove the blue wavelength from the green color pixel to improve gamut area of the display device 100.

Figure 4:
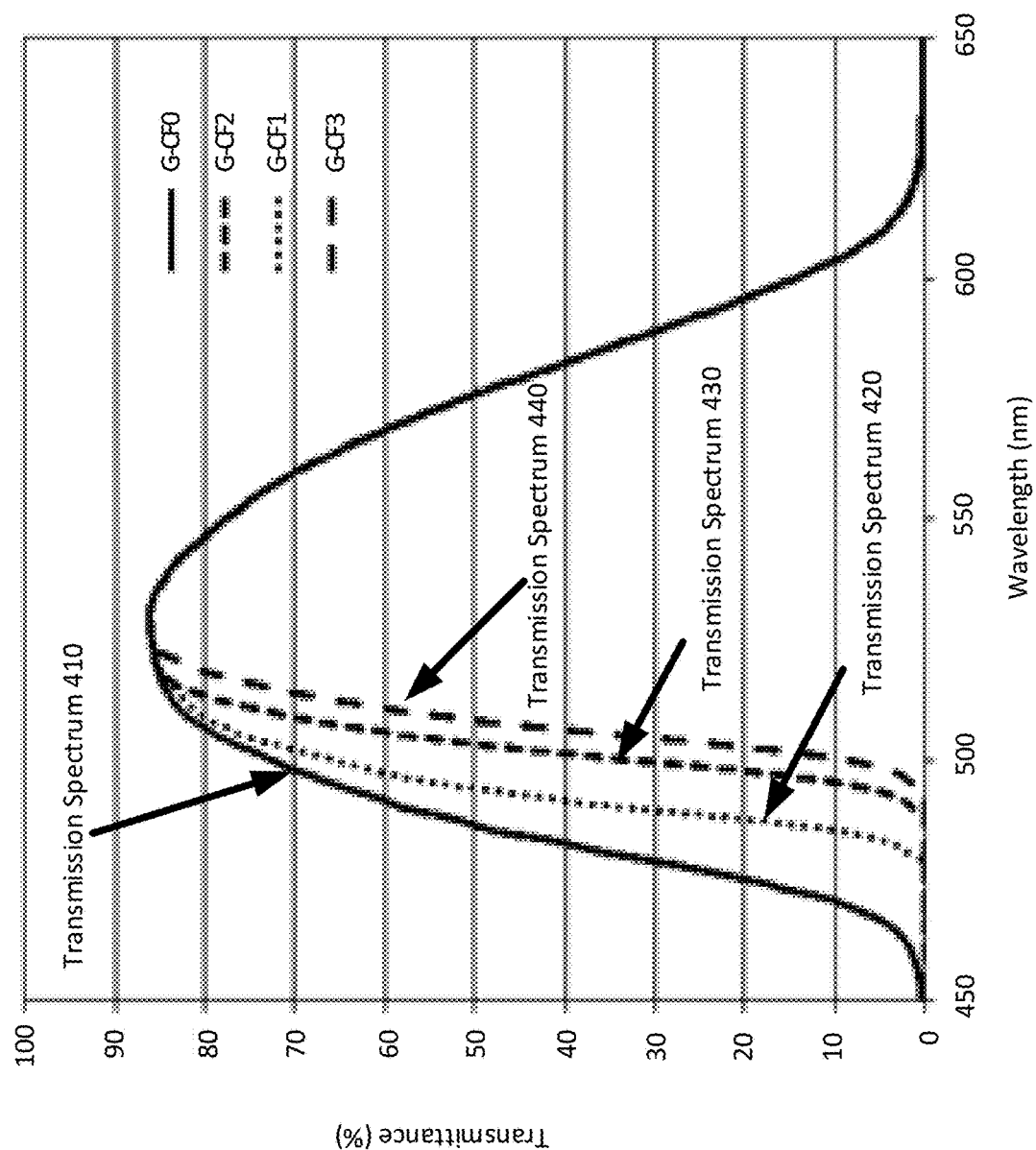
FIG. 4 is a diagram illustrating green color filters with different transmission spectra according to embodiments of the invention.

FIG. 4 shows green color filters with different transmission spectra according to embodiments of the invention. The transmission spectrum 410 is that of a green color filter G-CF0 which is a conventional green color filter, the transmission spectrum 420 is that of a green color filter G-CF1, the transmission spectrum 430 is that of a green color filter G-CF2, and the transmission spectrum 440 is that of a green color filter G-CF3. Compared to the transmission spectrum 410 of the green color filter G-CF0, the transmission spectra 420, 430 and 440 of the improved green color filters 134 (i.e., G-CF1, G-CF2 and G-CF3) are cut off at 480 nm, 490 nm and 495 nm. In other words, the improved green color filters 134 (i.e., G-CF1, G-CF2 and G-CF3), reflected by transmission spectra 420, 430 and 440, block more blue wavelength of the light source (e.g., the backlight unit 110).

In certain embodiments, the transmittance of the green color filter 134 is below 25%, 20%, 15%, 10% and 5% at the wavelength shorter than 480 nm. In certain embodiments, the transmittance of the green color filter 134 is below 25%, 20%, 15%, 10% and 5% at the wavelength shorter than 485 nm. In certain embodiments, the transmittance of the green color filter 134 is below 25%, 20%, 15%, 10% and 5% at the wavelength shorter than 490 nm. In certain embodiments, the transmittance of the green color filter is below 25%, 20%, 15%, 10% and 5% at the wavelength shorter than 495 nm. In certain embodiments, the transmittance of the green color filter is below 25%, 20%, 15%, 10% and 5% at the wavelength shorter than 500 nm.

In certain embodiments, the blue color filter 132 can be tuned such that it can block green wavelength to reduce interference of the green wavelength on the blue pixels. In certain embodiments, the transmittance of the blue color filter 132 is below 25%, 20%, 15%, 10% and 5% at the wavelength longer than 500 nm. In certain embodiments, the transmittance of the blue color filter 132 is below 25%, 20%, 15%, 10% and 5% at the wavelength longer than 505 nm. In certain embodiments, the transmittance of the blue color filter 132 is below 20%, 15%, 10% and 5% at the wavelength longer than 510 nm.

Figure 5:
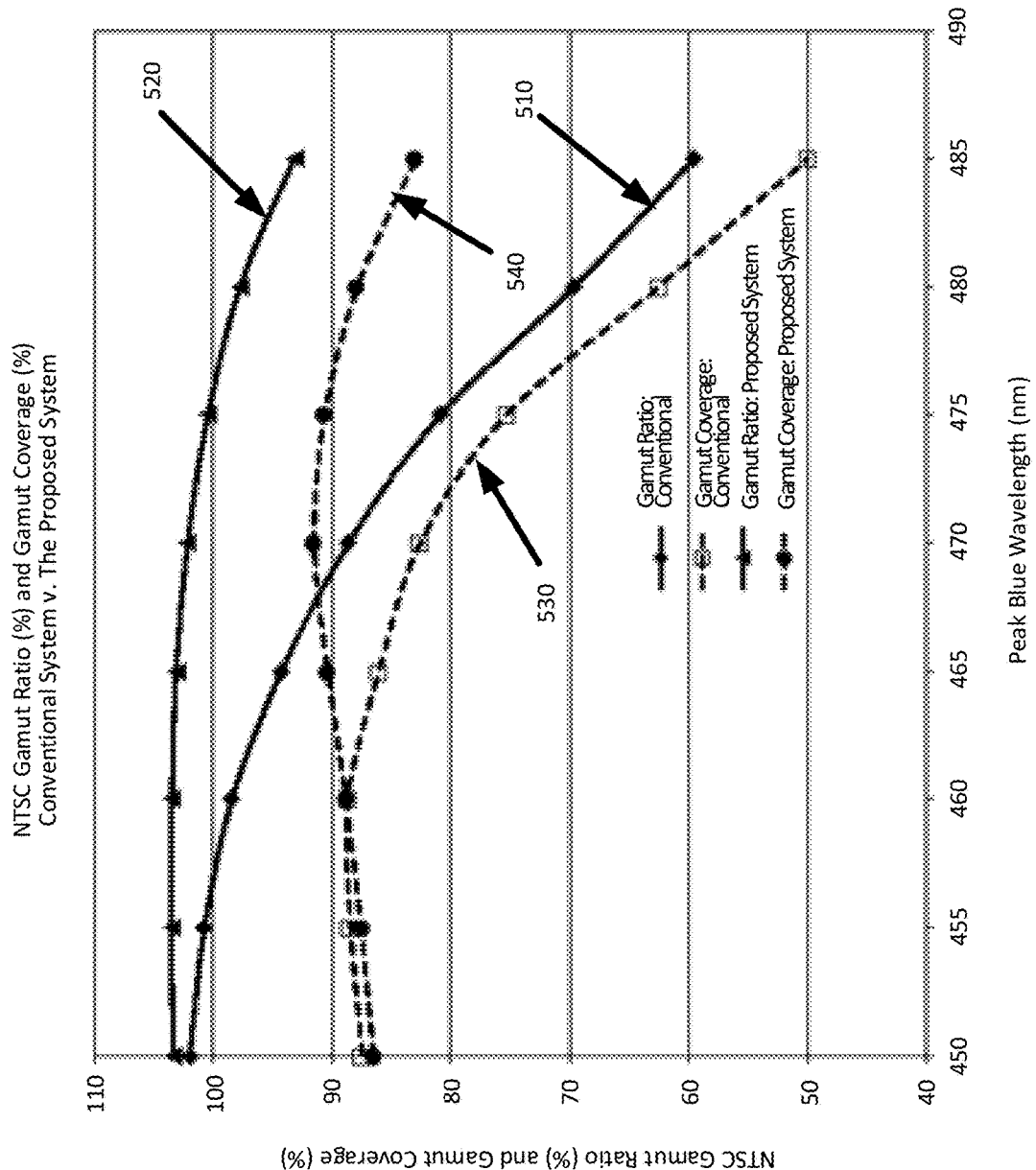
FIG. 5 is a diagram illustrating the NTSC gamut ratio and gamut coverage of a conventional system and the proposed system according to one embodiment of the invention.

The more the blue wavelength of the light source is blocked by the green color filter, the higher color gamut area can be achieved with this display device 100. FIG. 5 shows the NTSC gamut ratio and gamut coverage of a conventional system and the proposed system (e.g., the display device 100) according to one embodiment of the invention.

The curve 510 is the NTSC gamut ratio of a conventional system, while the curve 520 is the NTSC gamut ration of the proposed system (e.g., the display device 100). Similarly, the curve 530 is the NTSC gamut coverage of a conventional system, while the curve 540 is the NTSC gamut coverage of the proposed system (e.g., the display device 100). It can be found that by tuning the green color filter 134 with cut off at 480 nm or higher, the color gamut 520 can be maintained high with different light spectra with different blue light distribution. For example, when the peak blue wavelength is 485 nm, the conventional system has a NTSC gamut ratio lower than 60%, while the proposed system has a NTSC gamut ratio higher than 90%. Additionally, as shown in FIG. 5, the proposed system of modified color filters provides color gamut less dependent on the peak wavelength of the blue spectrum than the conventional system.

The gamut ratio and gamut coverage, under NTSC and the ITU-R Recommendation BT.2020 (Rec. 2020), for white light spectra with a peak blue wavelength at 471 nm can be as high as or higher than that for white light spectra with a peak blue wavelength at 450 nm.

Figure 6:
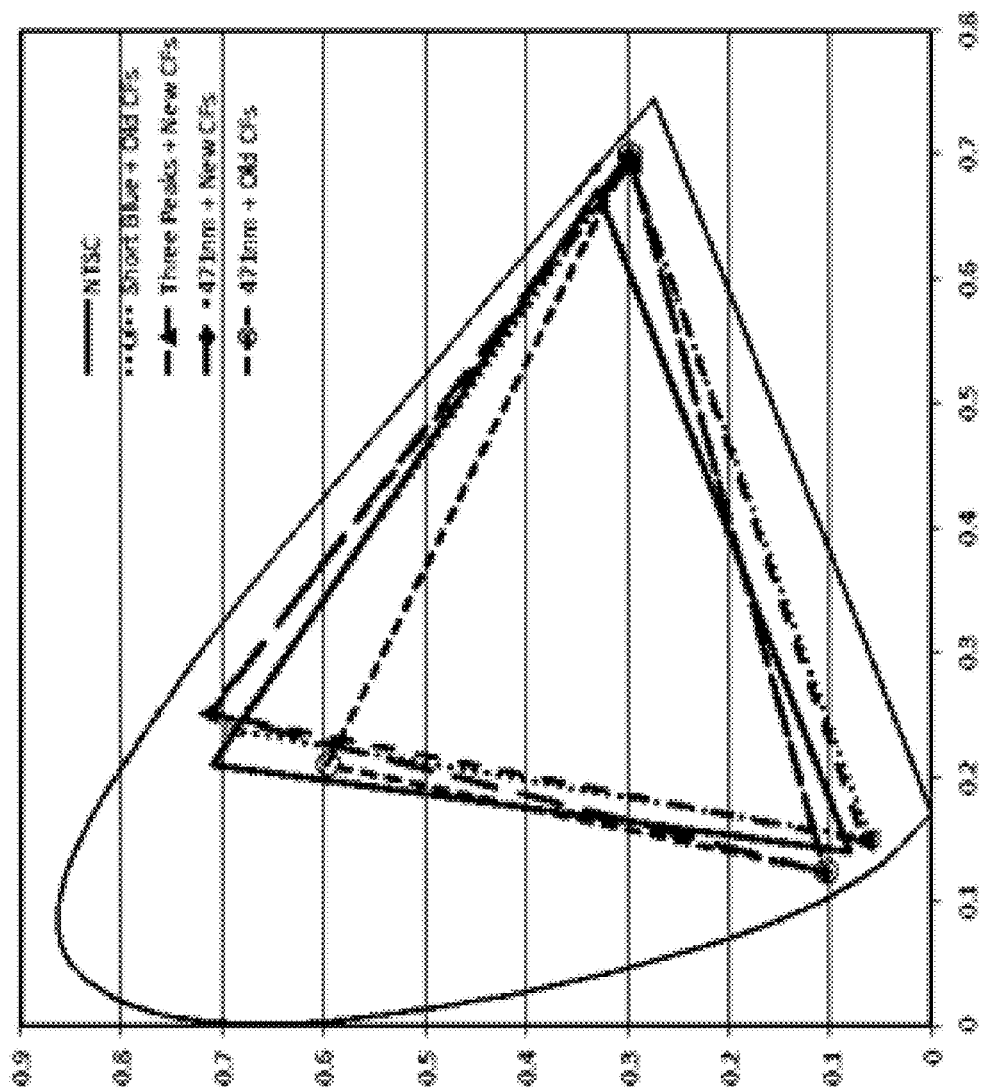
FIG. 6 is a diagram illustrating color gamut charts for different white light spectra and color filters to show color gamut area of proposed systems and conventional systems: (1) with a conventional short blue wavelength, and (2) with shifted blue wavelength and with broad distributed blue wavelength.

FIG. 6 shows color gamut charts for different white light spectra and color filters: (1) with a conventional short blue wavelength, and (2) with shifted blue wavelength and with broad distributed blue wavelength. As shown in FIG. 6, the system of the invention has color gamut area being larger than the color gamut area of the conventional system with the blue component of a longer wavelength or peak. FIG. 7 shows a NTSC gamut ratio and gamut coverage as well as Rec. 2020 gamut coverage of different color filters with different types of blue light.

It can be found that using the improved green color filters 134 (i.e., G-CF1, G-CF2 and G-CF3) can improve the gamut ratio and gamut coverage of the display device 100 under same conditions. Therefore, with the help of the improved green color filters 134 (i.e., G-CF1, G-CF2 and G-CF3), light sources (e.g., the backlight unit 110) with shifted blue wavelength (e.g., peak blue wavelength at 471 nm as shown in FIG. 7) and with broad distributed blue wavelength (e.g., three peaks of blue wavelength to spread out the blue intensity) can still achieve as good as or even better gamut ratio and gamut coverage compared to conventional short blue wavelength display. In other words, compared with conventional blue wavelength display, the display device 100 according to the invention can solve the problem of tiredness by avoiding using short blue wavelength light source, without the expense of lower gamut ratio and gamut coverage.

In other display devices having RGB sources representing each color pixel (e.g., RGB displays or OLED displays), the blue light spectrum with its peak shifted to 471 nm can also provide high color gamut coverage compared to conventional light spectrum with its blue light peak at 450 nm. As shown in FIG. 7, for RGB source with blue peak at 471 nm, the NTSC and Rec. 2020 gamut coverage is 98.6% and 84.6%, respectively. For RGB with blue peak at 450 nm, the NTSC and Rec. 2020 gamut coverage is 97.9% and 87.4%, respectively.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments are chosen and described in order to explain the principles of the disclosure and their practical application so as to activate others skilled in the art to utilize the disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A display device, comprising:
a liquid crystal display (LCD) panel comprising a plurality of blue color filters, a plurality of green color filters, and a plurality of red color filters, wherein the green color filters have a transmission of less than or equal to 10% at a wavelength being 480 nm or shorter than 480 nm; and
a light source configured to provide light to the LCD panel, wherein the light has a spectrum with a blue component, a green component and a red component;
wherein the blue component has at least one peak wavelength in between 480.1 nm and less than or equal 495 nm, and wherein the blue component has intensity of a peak at a longer wavelength being higher than the intensity of a peak at a shorter wavelength.

2. The display device of claim 1, wherein the plurality of green color filters has a transmission of less than or equal to 30% at the wavelength being 490 nm.

3. The display device of claim 1, wherein the plurality of blue color filters has a transmission of less than or equal 10% at a wavelength being 510 nm or longer than 510 nm.

4. The display device of claim 1, wherein the plurality of green color filters has a transmission of less than or equal to 5% at the wavelength being 480 nm, 10% at the wavelength being 485 nm, 30% at the wavelength being 490 nm, and 50% at the wavelength being 495 nm.

5. The display device of claim 3, wherein the plurality of blue color filters has a transmission of less than or equal to 10% at the wavelength being 515 nm or longer than 515 nm.

\* \* \* \* \*